United States Patent
Murase et al.

(10) Patent No.: US 12,378,377 B2
(45) Date of Patent: Aug. 5, 2025

(54) CYCLIC OLEFIN-BASED COPOLYMER COMPOSITION, VARNISH, AND CROSS-LINKED PRODUCT

(71) Applicant: MITSUI CHEMICALS, INC., Tokyo (JP)

(72) Inventors: Hirohiko Murase, Ichihara (JP); Koutarou Asahina, Ichihara (JP); Fumito Takeuchi, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 951 days.

(21) Appl. No.: 17/295,072

(22) PCT Filed: Nov. 22, 2019

(86) PCT No.: PCT/JP2019/045844
§ 371 (c)(1),
(2) Date: Apr. 28, 2022

(87) PCT Pub. No.: WO2020/110958
PCT Pub. Date: Jun. 4, 2020

(65) Prior Publication Data
US 2022/0275135 A1     Sep. 1, 2022

(30) Foreign Application Priority Data

Nov. 27, 2018   (JP) ................. 2018-221022

(51) Int. Cl.
*C08J 5/24* (2006.01)
*C08F 287/00* (2006.01)
*H05K 1/03* (2006.01)

(52) U.S. Cl.
CPC ............ *C08J 5/249* (2021.05); *C08F 287/00* (2013.01); *C08J 5/24* (2013.01); *H05K 1/0353* (2013.01)

(58) Field of Classification Search
CPC ....... C08J 5/249; C08J 5/24; C08J 5/18; C08J 2365/00; C08L 65/00; C08G 61/08; C08G 2261/1412; C08G 2261/1414; C08F 287/00; C08F 210/02; C08F 4/64048; H05K 1/0353; H05K 1/0346; C09D 165/00; B32B 15/08; B32B 15/085

USPC .......................................... 524/570
See application file for complete search history.

(56) References Cited

U.S. PATENT DOCUMENTS

| | | | |
|---|---|---|---|
| 9,206,278 B2 * | 12/2015 | Yoshida | C08F 8/00 |
| 9,902,695 B1 | 2/2018 | Das et al. | |
| 10,662,321 B2 * | 5/2020 | Saito | C09D 123/16 |
| 2008/0045619 A1 * | 2/2008 | Jackson | C08L 23/04 |
| | | | 522/66 |
| 2013/0178575 A1 | 7/2013 | Yoshida et al. | |
| 2014/0235393 A1 * | 8/2014 | Sakanaka | F16G 5/166 |
| | | | 474/263 |
| 2018/0170873 A1 | 6/2018 | Das et al. | |
| 2023/0059817 A1 * | 2/2023 | Nakai | C08F 236/20 |

FOREIGN PATENT DOCUMENTS

| | | | |
|---|---|---|---|
| JP | 2005047992 A | * | 2/2005 |
| JP | 2010100843 A | | 5/2010 |
| JP | 2015067822 A | | 4/2015 |
| JP | 2016017089 A | | 2/2016 |
| KR | 2018013406 | * | 2/2018 |
| WO | 2012046443 A1 | | 4/2012 |
| WO | 2018111337 A1 | | 6/2018 |

OTHER PUBLICATIONS

Machine translation of JP-2005047992-A, retrieved Aug. 15, 2024. (Year: 2005).*

* cited by examiner

*Primary Examiner* — Hannah J Pak
(74) *Attorney, Agent, or Firm* — BUCHANAN INGERSOLL & ROONEY PC

(57) ABSTRACT

A cyclic olefin-based copolymer resin composition includes a cyclic olefin-based copolymer (M); and a maleimide compound (L), in which the cyclic olefin-based copolymer (M) includes a cyclic olefin-based copolymer (m) including a repeating unit represented by a specific general formula, the maleimide compound (L) has a solubility parameter (SP value) obtained by Fedors method of 19 $J^{1/2}/cm^{3/2}$ or more and 26 $J^{1/2}/cm^{3/2}$ or less and includes a maleimide compound (l), which is a bismaleimide compound having at least two maleimide groups in a molecule, and when a total of the cyclic olefin-based copolymer (M) and the maleimide compound (L) is 100 parts by mass, a content of the maleimide compound (L) is 1 part by mass or more and 50 parts by mass or less.

15 Claims, No Drawings

CYCLIC OLEFIN-BASED COPOLYMER COMPOSITION, VARNISH, AND CROSS-LINKED PRODUCT

TECHNICAL FIELD

The present invention relates to a cyclic olefin-based copolymer composition, a varnish, and a cross-linked product.

BACKGROUND ART

In recent years, increases in the number of wireless communication devices and the like using high frequency bands and increases in communication speeds have inevitably led to high frequency bands being widely used. Along with this, there is a demand for materials for circuit substrates having high insulation and a small dielectric loss tangent to reduce transmission loss at high frequencies as much as possible.

Examples of resin materials used for such circuit substrates include the cyclic olefin copolymers obtained by copolymerizing a diene described in Patent Document 1 and Patent Document 2.

Patent Document 1 and Patent Document 2 disclose that a sheet obtained by cross-linking a cyclic olefin copolymer obtained by copolymerizing a specific diene compound with an organic peroxide or the like exhibits excellent dielectric characteristics.

Furthermore, Patent Document 3 discloses resin compositions including a cyclic olefin copolymer obtained by copolymerizing a specific diene compound and various resins.

RELATED DOCUMENT

Patent Document

[Patent Document 1] Japanese Unexamined Patent Publication No. 2010-100843
[Patent Document 2] International Publication No. 2012/046443
[Patent Document 3] Japanese Unexamined Patent Publication No. 2015-067822

SUMMARY OF THE INVENTION

Technical Problem

According to the studies of the present inventors, it is clear that, in order to use the cross-linked product obtained from the cyclic olefin copolymers described in Patent Documents 1 to 3 as a material for a circuit substrate, it was necessary to improve the heat resistance and mechanical strength thereof while maintaining the uniformity and dielectric characteristics thereof.

The present invention was made in view of the above circumstances and has an object of providing, as a material for a circuit substrate, a resin composition capable of obtaining a cross-linked product excellent in dielectric characteristics in a high frequency band, heat resistance, and mechanical properties, which is suitable for an interlayer insulating film (also referred to as an interlayer insulating layer in a circuit substrate) for a circuit substrate for a highly integrated arithmetic unit, a circuit substrate, or the like.

Solution to Problem

The present invention was made in view of the above circumstances and was found to improve heat resistance while satisfying the dielectric characteristics in a high frequency band suitable for a circuit substrate or the like, thereby completing the present invention.

That is, according to the present invention, the cyclic olefin-based copolymer composition, varnish, and cross-linked product shown below are provided.

[1]
A cyclic olefin-based copolymer resin composition including a cyclic olefin-based copolymer (M); and
a maleimide compound (L)
in which the cyclic olefin-based copolymer (M) includes a cyclic olefin-based copolymer (m) including
a repeating unit derived from one or more kinds of olefins represented by General Formula (I),
a repeating unit derived from one or more kinds of cyclic non-conjugated dienes represented by General Formula (III), and
a repeating unit derived from one or more kinds of cyclic olefins represented by General Formula (V),
the maleimide compound (L) has a solubility parameter (SP value) obtained by Fedors method of 19 $J^{1/2}/cm^{3/2}$ or more and 26 $J^{1/2}/cm^{3/2}$ or less and includes a maleimide compound (l), which is a bismaleimide compound having at least two maleimide groups in a molecule, and
when a total of the cyclic olefin-based copolymer (M) and the maleimide compound (L) is 100 parts by mass, a content of the maleimide compound (L) is 1 part by mass or more and 50 parts by mass or less.

[Chem. 1]

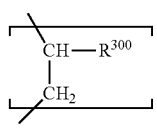

(I)

(in General Formula (I), $R^{300}$ represents a hydrogen atom or a linear or branched hydrocarbon group having 1 to 29 carbon atoms)

[Chem. 2]

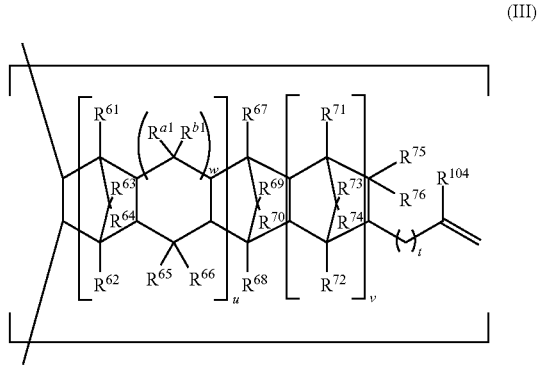

(III)

(in General Formula (III), u is 0 or 1, v is 0 or a positive integer, w is 0 or 1, $R^{61}$ to $R^{76}$ and $R^{a1}$ and $R^{b1}$, which may be the same or different from each other, are a hydrogen atom, a halogen atom, an alkyl group having 1 to 20 carbon atoms, a halogenated alkyl group having 1 to 20 carbon atoms, a cycloalkyl group having 3 to 15 carbon atoms, or an aromatic hydrocarbon group having 6 to 20 carbon atoms, $R^{104}$ is a hydrogen atom or an alkyl group having 1 to 10 carbon atoms, t is a positive integer of 0 to 10, and $R^{75}$ and $R^{76}$ may bond with each other to form a monocyclic or polycyclic ring)

[Chem. 3]

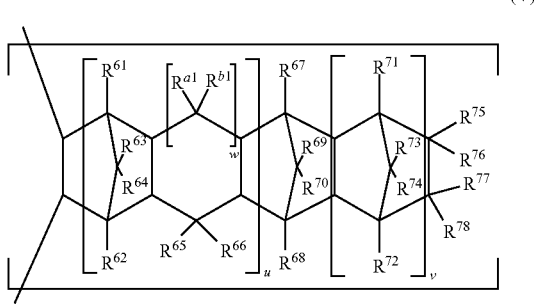

(V)

(in General Formula (V), u is 0 or 1, v is 0 or a positive integer, w is 0 or 1, $R^{61}$ to $R^{78}$ and $R^{a1}$ and $R^{b1}$, which may be the same or different from each other, are a hydrogen atom, a halogen atom, an alkyl group having 1 to 20 carbon atoms, a halogenated alkyl group having 1 to 20 carbon atoms, a cycloalkyl group having 3 to 15 carbon atoms, or an aromatic hydrocarbon group having 6 to 20 carbon atoms, and $R^{75}$ to $R^{78}$ may bond with each other to form a monocyclic or polycyclic ring)

[2]

The cyclic olefin-based copolymer resin composition according to [1], in which, when a total number of moles of the repeating units in the cyclic olefin-based copolymer (m) is 100 mol %, a content of the repeating units derived from the cyclic non-conjugated dienes is in a range of 19 mol % or more and 40 mol % or less.

[3]

The cyclic olefin-based copolymer resin composition according to [1] or [2], in which, in the cyclic olefin-based copolymer (m), the cyclic non-conjugated diene forming the repeating unit derived from the cyclic non-conjugated dienes includes 5-vinyl-2-norbornene, and the cyclic olefin forming the repeating unit derived from the cyclic olefins includes tetracyclo[4.4.0.1$^{2,5}$.1$^{7,10}$]-3-dodecene.

[4]

The cyclic olefin-based copolymer resin composition according to [1] to [3], in which a molecular weight of the maleimide compound (l) is 300 or more and 1000 or less.

[5]

The cyclic olefin-based copolymer resin composition according to any one of [1] to [4], further including a compatibility agent (C) for compatibilizing the cyclic olefin-based copolymer (m) and the maleimide compound (l).

[6]

The cyclic olefin-based copolymer resin composition according to [5], in which, when the total of the cyclic olefin-based copolymer (m) and the maleimide compound (l) is 100 parts by mass, a content of the compatibility agent (C) is 0.1 parts by mass or more and 10 parts by mass or less.

[7]

A varnish including the cyclic olefin-based copolymer composition according to any one of [1] to [6], and a solvent.

[8]

The varnish according to [7], in which the solvent is formed of a mixed solvent including at least one non-polar solvent (X) and at least one polar solvent (Y).

[9]

The varnish according to [8], in which the non-polar solvent (X) includes at least one selected from toluene, xylene, cyclohexane, and decalin and the polar solvent (Y) includes at least one selected from methyl isobutyl ketone, methyl ethyl ketone, diisobutyl ketone, methyl propyl ketone, and cyclohexanone, and when a total amount of the non-polar solvent (X) and the polar solvent (Y) is 100% by mass, a content of the non-polar solvent (X) is 70% by mass or more and 95% by mass or less, and a content of the polar solvent (Y) is 5% by mass or more and 30% by mass or less.

[10]

A cross-linked product obtained by cross-linking the cyclic olefin-based copolymer composition according to any one of [1] to [6].

[11]

A film or sheet including the cross-linked product according to [10].

[12]

A laminate including the cross-linked product according to [10].

[13]

A circuit substrate including an electrically insulating layer including the cross-linked product according to [10], and a conductor layer provided on the electrically insulating layer.

[14]

An electronic device including the circuit substrate according to [13].

[15]

A prepreg including the cyclic olefin-based copolymer composition according to any one of [1] to [6], and a sheet-like fiber base material.

Advantageous Effects of Invention

According to the present invention, it is possible to provide a cyclic olefin-based copolymer composition capable of obtaining a cross-linked product which is superior in heat resistance and mechanical strength while maintaining dielectric characteristics and uniformity in a high frequency band suitable for a circuit substrate or the like.

DESCRIPTION OF EMBODIMENTS

A description will be given below of the present invention based on embodiments. In the present embodiment, "A to B" indicating a numerical range represents A or more and B or less unless otherwise specified.

First, a description will be given of the cyclic olefin-based polymer composition of an embodiment according to the present invention. The cyclic olefin-based polymer composition according to the present embodiment includes a cyclic olefin-based copolymer (M) and a maleimide compound (L).

The cyclic olefin-based copolymer (M) includes a cyclic olefin-based copolymer (m) including a repeating unit derived from one or more kinds of olefins represented by General Formula (I), a repeating unit derived from one or more kinds of cyclic non-conjugated dienes represented by General Formula (III), and a repeating unit derived from one or more kinds of cyclic olefins represented by General Formula (V), the maleimide compound (L) has a solubility parameter (SP value) obtained by Fedors method of 19

$J^{1/2}/cm^{3/2}$ or more and 26 $J^{1/2}/cm^{3/2}$ or less and includes a maleimide compound (l), which is a bismaleimide compound having at least two maleimide groups in the molecule.

In addition, when the total amount of the cyclic olefin-based copolymer (M) and the maleimide compound (L) included in the cyclic olefin-based polymer composition according to the present embodiment is 100 parts by mass, the content of the maleimide compound (L) is 1 part by mass or more and 50 parts by mass or less, preferably 1 part by mass or more and 40 parts by mass or less, more preferably 1 part by mass or more and 30 parts by mass or less, and even more preferably 1 part by mass or more and 25 parts by mass or less.

According to the cyclic olefin-based polymer composition according to the present embodiment, the cyclic olefin-based copolymer (m) of the aspect described above is included as the cyclic olefin-based copolymer (M), the maleimide compound (l) of the aspect described above is included as the maleimide compound (L), and the blending amount of the cyclic olefin-based copolymer (M) and the maleimide compound (L) is set within the above numerical range, such that it is possible to obtain a cyclic olefin-based copolymer composition capable of obtaining a cross-linked product having superior heat resistance and mechanical strength and preventing deterioration of the dielectric characteristics of the cross-linked product while maintaining compatibility between the cyclic olefin-based copolymer (M) and the maleimide compound (L).

Cyclic Olefin-Based Copolymer (M)

First, a description will be given of the cyclic olefin-based copolymer (M) according to the present embodiment. As described above, the cyclic olefin-based copolymer (M) according to the present embodiment includes the cyclic olefin-based copolymer (m). In addition, it is also possible for the cyclic olefin-based copolymer composition according to the present embodiment to further contain a cyclic olefin-based polymer (n) different from the cyclic olefin-based copolymer (m).

First, a description will be given below of the cyclic olefin-based copolymer (m) of the present embodiment according to the present invention.

Cyclic Olefin-Based Copolymer (m)

The cyclic olefin-based copolymer (m) according to the present embodiment is a cyclic olefin-based copolymer having a cross-linkable group including a repeating unit derived from one or more kinds of olefins represented by General Formula (I), a repeating unit derived from one or more kinds of cyclic non-conjugated dienes represented by General Formula (III), and a repeating unit derived from one or more kinds of cyclic olefins represented by General Formula (V).

In a case where the total number of moles of the repeating units in the cyclic olefin-based copolymer (m) is 100 mol %, the content of the repeating units derived from the cyclic non-conjugated dienes is preferably 19 mol % or more and 40 mol % or less, preferably 20 mol % or more and 39 mol % or less, and more preferably 23 mol % or more and 38 mol % or less.

When the content of the repeating unit derived from the cyclic non-conjugated dienes is within the above range, the cross-linked product (Q) obtained from the cyclic olefin-based copolymer (m) is excellent in the stability over time of the dielectric characteristics and also excellent in heat resistance. Furthermore, it is possible to obtain a cross-linked product (Q) also having excellent mechanical properties, dielectric characteristics, transparency, and gas barrier properties. In other words, it is possible to obtain a cross-linked product having an excellent balance of these physical properties.

When the content of the repeating unit derived from the cyclic non-conjugated dienes is the above upper limit value or less, the moldability and solubility of the cyclic olefin-based copolymer (m) are improved and the stability over time of the dielectric characteristics of the cross-linked product (Q) is improved. When the content of the repeating unit derived from the cyclic non-conjugated dienes is the lower limit value or more, the heat resistance and mechanical properties of the cross-linked product (Q) obtained by cross-linking the cyclic olefin-based copolymer (m) are improved.

In addition, a number average molecular weight Mn of the cyclic olefin-based copolymer (m) is 3,000 or more, preferably 4,500 or more, and more preferably 6,000 or more. When the number average molecular weight Mn of the cyclic olefin-based copolymer (m) is the above lower limit value or more, it is possible to improve the dielectric characteristics, heat resistance, and mechanical properties of the cross-linked product (Q) obtained by cross-linking the cyclic olefin-based copolymer (m) or the cyclic olefin-based copolymer composition according to the present embodiment.

In addition, the number average molecular weight Mn of the cyclic olefin-based copolymer (m) is 30,000 or less, preferably 25,000 or less, and more preferably 20,000 or less. When the number average molecular weight Mn of the cyclic olefin-based copolymer (m) is the above upper limit value or less, it is possible to improve the moldability such as impregnation property into the fiber base material and the wire embedding property of the cyclic olefin-based copolymer (m) or the cyclic olefin-based copolymer composition according to the present embodiment during circuit substrate production.

It is possible to control the number average molecular weight Mn of the cyclic olefin-based copolymer (m) according to polymerization conditions such as the polymerization catalyst, the co-catalyst, the amount of $H_2$ added, and the polymerization temperature.

Here, when the number average molecular weight Mn of the cyclic olefin-based copolymer (m) is within the above range, it is possible to improve the fluidity, mechanical properties, and moldability, such as the impregnation property into the fiber base material and the wire embedding property during circuit substrate production, while the dielectric characteristics of cyclic olefin-based copolymer (m) are excellent.

Here, in the cyclic olefin copolymer of the related art, when the number average molecular weight is within the above range, the molecular weight is relatively low, thus, the heat resistance, the dielectric characteristics, the mechanical properties, and the like of the obtained cross-linked product tend to deteriorate. However, even when the number average molecular weight Mn is within the above range, the cyclic olefin-based copolymer (m) according to the present embodiment has a good impregnation property into the fiber base material and the mixing property with additives such as an inorganic filler or a flame retardant is improved, thus, it is possible to suppress a decrease in mechanical strength.

In the cyclic olefin-based copolymer (m) according to the present embodiment, in a case where the total number of moles of the repeating units in the cyclic olefin-based copolymer (m) is 100 mol %, the total of the content of the repeating unit derived from the cyclic non-conjugated dienes and the content of the repeating unit derived from the cyclic olefins is preferably in a range of less than 60 mol %, more preferably in a range of less than 50 mol %, and even more preferably in a range of less than 48 mol %.

The lower limit of the total content of the repeating unit derived from the cyclic non-conjugated dienes and the content of the repeating unit derived from the cyclic olefins is not particularly limited, but is, for example, 20 mol % or more, and preferably 26 mol % or more.

[Chem. 4]

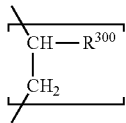

(I)

In General Formula (I), $R^{300}$ represents a hydrogen atom or a linear or branched hydrocarbon group having 1 to 29 carbon atoms.

[Chem. 5]

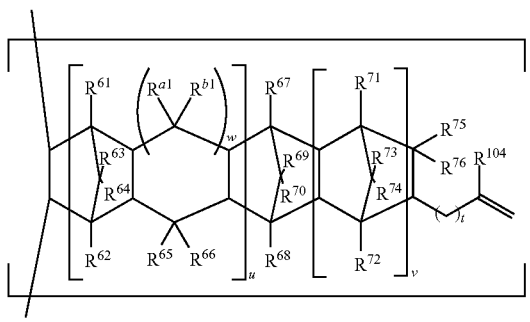

(III)

In General Formula (III), u is 0 or 1, v is 0 or a positive integer, preferably an integer of 0 or more to 2 or less, and more preferably 0 or 1, w is 0 or 1, $R^{61}$ to $R^{76}$ and $R^{a1}$ and $R^{b1}$, which may be the same or different from each other, are a hydrogen atom, a halogen atom, an alkyl group having 1 to 20 carbon atoms, a halogenated alkyl group having 1 to 20 carbon atoms, a cycloalkyl group having 3 to 15 carbon atoms, or an aromatic hydrocarbon group having 6 to 20 carbon atoms, $R^{104}$ is a hydrogen atom or an alkyl group having 1 to 10 carbon atoms, t is a positive integer of 0 to 10, and $R^{75}$ and $R^{76}$ may bond with each other to form a monocyclic or polycyclic ring.

[Chem. 6]

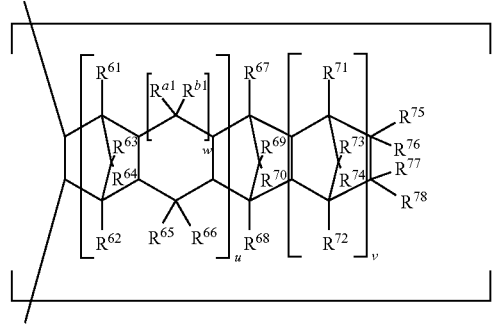

(V)

In General Formula (V), u is 0 or 1, v is 0 or a positive integer, preferably an integer of 0 or more to 2 or less, and more preferably 0 or 1, w is 0 or 1, $R^{61}$ to $R^{78}$ and $R^{a1}$ and $R^{b1}$, which may be the same or different from each other, are a hydrogen atom, a halogen atom, an alkyl group having 1 to 20 carbon atoms, a halogenated alkyl group having 1 to 20 carbon atoms, a cycloalkyl group having 3 to 15 carbon atoms, or an aromatic hydrocarbon group having 6 to 20 carbon atoms, and $R^{75}$ to $R^{78}$ may bond with each other to form a monocyclic or polycyclic ring.

In the cyclic olefin-based copolymer (m), in a case where the total number of moles of the repeating units in the cyclic olefin-based copolymer (m) is 100 mol %, the content of the repeating unit derived from olefins is preferably 20 mol % or more and 80 mol % or less, more preferably 30 mol % or more and 75 mol % or less, even more preferably 40 mol % or more and 70 mol % or less, and particularly preferably 50 mol % or more and 70 mol % or less, the content of the repeating unit derived from cyclic non-conjugated dienes is 19 mol % or more and 40 mol % or less, preferably 20 mol % or more and 39 mol % or less, more preferably 23 mol % or more and 38 mol % or less, and the content of the repeating unit derived from cyclic olefins is preferably 1 mol % or more and 30 mol % or less, more preferably 2 mol % or more and 25 mol % or less, and even more preferably 3 mol % or more and 20 mol % or less.

When each of the contents of the repeating units in the cyclic olefin-based copolymer (m) is within the above range, the cross-linked product (Q) obtained from the cyclic olefin-based copolymer composition (m) is excellent in terms of the stability over time of the dielectric characteristics and also excellent in heat resistance. Furthermore, it is possible to obtain a cross-linked product (Q) having excellent mechanical properties, dielectric characteristics, transparency, and gas barrier properties. In other words, it is possible to obtain a cross-linked product (Q) excellent in terms of the balance of these physical properties.

The olefin monomer, which is one of the copolymerization raw materials of the cyclic olefin-based copolymer (m), is a monomer which provides the skeleton represented by Formula (I) by addition copolymerization, and is an olefin represented by General Formula (Ia).

[Chem. 7]

(Ia)

In General Formula (Ia), $R^{300}$ represents a hydrogen atom or a linear or branched hydrocarbon group having 1 to 29 carbon atoms. Examples of the olefin represented by General Formula (Ia) include ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, and the like.

From the viewpoint of obtaining a cross-linked product (Q) having superior heat resistance, mechanical properties, dielectric characteristics, transparency, and gas barrier properties, among the above, ethylene and propylene are preferable, and ethylene is particularly preferable. Two or more olefin monomers represented by Formula (Ia) may be used.

The cyclic non-conjugated diene monomer, which is one of the copolymerization raw materials of the cyclic olefin-based copolymer (m), is subjected to addition copolymerization to form a constituent unit represented by Formula (III). Specifically, a cyclic non-conjugated diene represented by General Formula (IIIa) corresponding to General Formula (III) is used.

[Chem. 8]

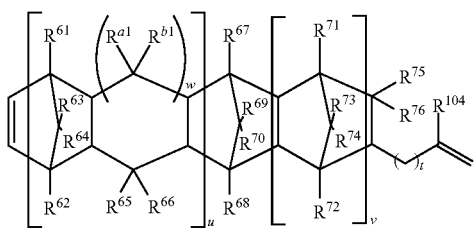
(IIIa)

In General Formula (IIIa), u is 0 or 1, v is 0 or a positive integer, preferably an integer of 0 or more to 2 or more, and more preferably 0 or 1, w is 0 or 1, $R^{61}$ to $R^{76}$ and $R^{a1}$ and $R^{b1}$, which may be the same or different from each other, are a hydrogen atom, a halogen atom, an alkyl group having 1 to 20 carbon atoms, a halogenated alkyl group having 1 to 20 carbon atoms, a cycloalkyl group having 3 to 15 carbon atoms, or an aromatic hydrocarbon group having 6 to 20 carbon atoms, $R^{104}$ is a hydrogen atom or an alkyl group having 1 to 10 carbon atoms, t is a positive integer of 0 to 10, $R^{75}$ and $R^{76}$ may bond with each other to form a monocyclic or polycyclic ring.

The cyclic non-conjugated diene represented by General Formula (IIIa) is not particularly limited and examples thereof include cyclic non-conjugated dienes represented by the chemical formulas below. Among these, 5-vinyl-2-norbornene, and 8-vinyl-9-methyltetracyclo[4.4.0.1$^{2,5}$.1$^{7,10}$]-dodecene are preferable, and 5-vinyl-2-norbornene is particularly preferable.

[Chem. 9]

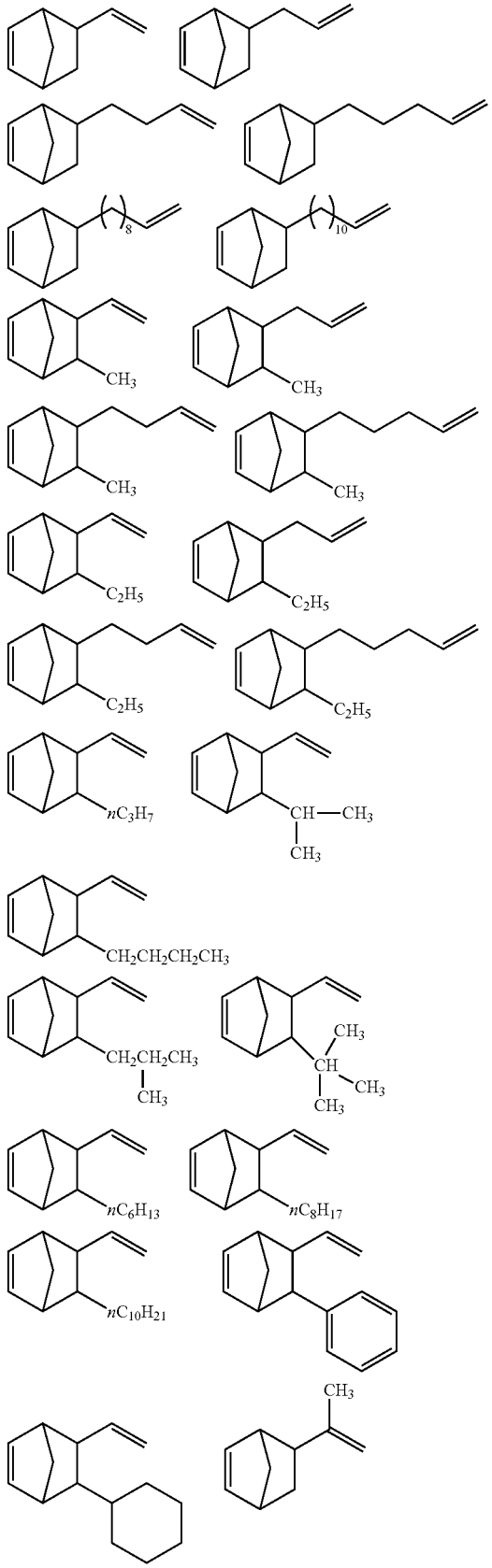

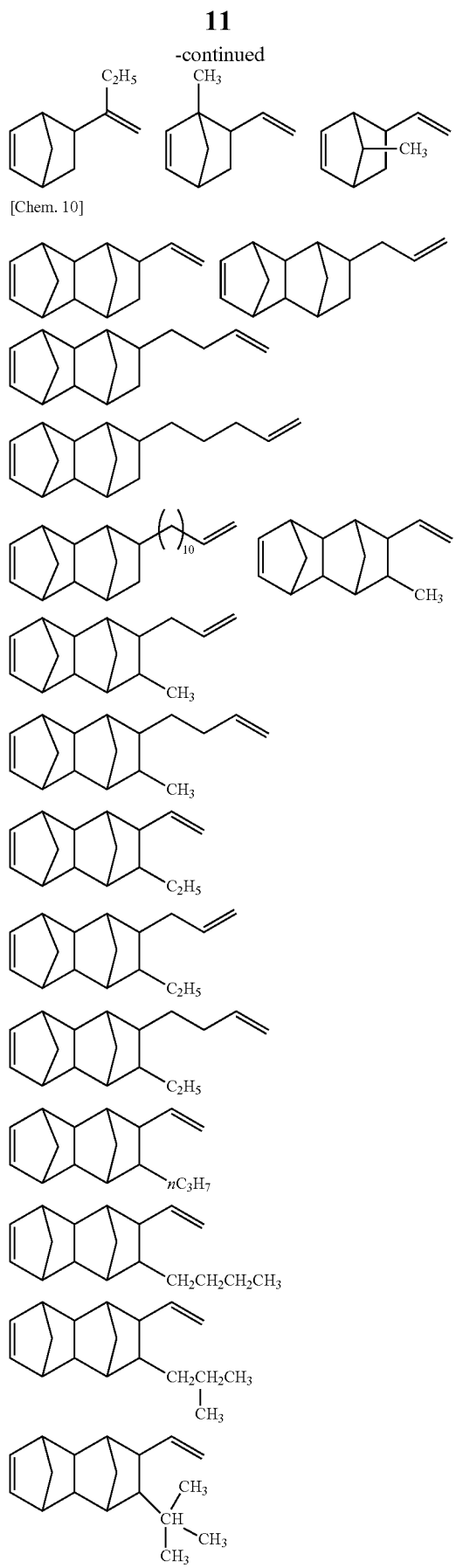

[Chem. 10]

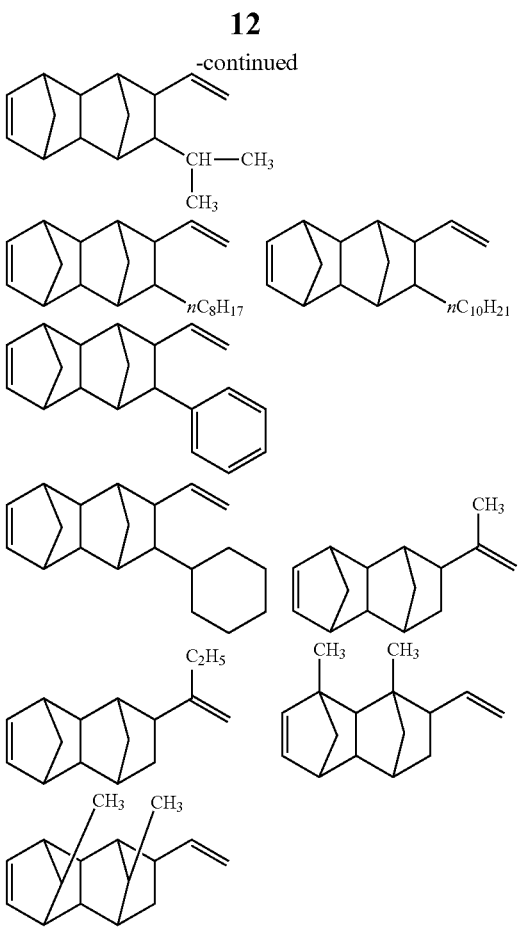

Specifically, it is also possible to represent the cyclic non-conjugated diene represented by General Formula (IIIa) by General Formula (IIIb).

[Chem. 11]

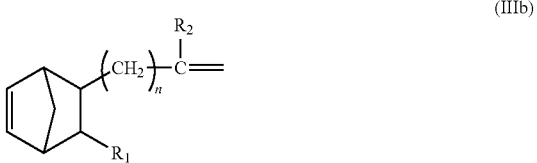

(IIIb)

n in General Formula (IIIb) is an integer of 0 to 10, $R_1$ is a hydrogen atom or an alkyl group having 1 to 10 carbon atoms, and $R_2$ is a hydrogen atom or an alkyl group having 1 to 5 carbon atoms.

The cyclic olefin-based copolymer (m) of the present embodiment including a constituent unit derived from a cyclic non-conjugated dienes represented by General Formula (III) means that the cyclic olefin-based copolymer (m) has a characteristic of having a double bond in a side chain portion, that is, a portion other than the main copolymerization chain.

The cyclic olefin monomer, which is one of the copolymerization raw materials of the cyclic olefin-based copolymer (m), is addition copolymerized to form a constituent unit represented by Formula (V). Specifically, a cyclic olefin monomer represented by General Formula (Va) corresponding to General Formula (V) is used.

[Chem. 12]

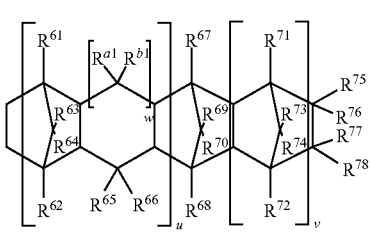

(Va)

In General Formula (Va), u is 0 or 1, v is 0 or a positive integer, preferably an integer of 0 or more and 2 or less, and more preferably 0 or 1, w is 0 or 1, $R^{61}$ to $R^{78}$ and $R^{a1}$ and $R^{b1}$, which may be the same or different from each other, are a hydrogen atom, a halogen atom, an alkyl group having 1 to 20 carbon atoms, a halogenated alkyl group having 1 to 20 carbon atoms, a cycloalkyl group having 3 to 15 carbon atoms, or an aromatic hydrocarbon group having 6 to 20 carbon atoms, and $R^{75}$ to $R^{78}$ may bond with each other to form a monocyclic or polycyclic ring.

As specific examples of the cyclic olefin represented by General Formula (Va), it is possible to use the compounds described in International Publication No. 2006/118261. As the cyclic olefin represented by General Formula (Va), bicyclo[2.2.1]-2-heptene (also referred to as norbornene), and tetracyclo[4.4.0.1$^{2,5}$.1$^{7,10}$]-3-dodecene (also referred to as tetracyclododecene) are preferable, and tetracyclo[4.4.0.1$^{2,5}$.1$^{7,10}$]-3-dodecene is more preferable. Since these cyclic olefins have a rigid ring structure, the modulus of elasticity of the copolymer and the cross-linked product is easily retained, and since these cyclic olefins do not include a heterogeneous double bond structure, there is an advantage in that cross-linking is easily controlled.

By using the olefin monomer represented by General Formula (Ia) and the cyclic olefin represented by General Formula (Va) as the copolymerization component, the solubility of the cyclic olefin-based copolymer (m) in a solvent is further improved, thus, the moldability is good and the yield of the product is improved.

In addition to a repeating unit derived from one or more kinds of olefins represented by General Formula (I), a repeating unit derived from cyclic non-conjugated dienes represented by General Formula (III), and a repeating unit derived from one or more kinds of cyclic olefins represented by General Formula (V), the cyclic olefin-based copolymer (m) may be formed by a repeating unit derived from a cyclic olefins other than the cyclic non-conjugated dienes represented by General Formula (III) and the cyclic olefins represented by General Formula (V), and/or derived from a chain polyene.

In such a case, in addition to the olefin monomer represented by General Formula (Ia), the cyclic non-conjugated diene monomer represented by General Formula (IIIa), and the cyclic olefin monomer represented by General Formula (Va), as the copolymerization raw materials of the cyclic olefin-based copolymer (m), it is possible to use cyclic olefin monomers other than the cyclic non-conjugated diene monomer represented by General Formula (IIIa) and the cyclic olefin monomer represented by General Formula (Va), and/ or a chain polyene monomer.

Such cyclic olefin monomers and chain polyene monomers are cyclic olefins represented by General Formula (VIa) or (VIIa), or chain polyenes represented by General Formula (VIIIa). Two or more different kinds of these cyclic olefins and chain polyenes may be used.

[Chem. 13]

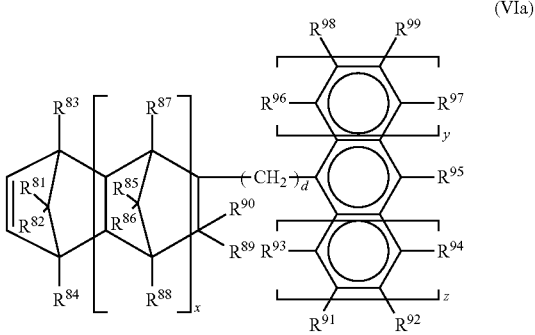

(VIa)

In General Formula (VIa), x and d are 0 or an integer of 1 or more, preferably an integer of 0 or more to 2 or less, and more preferably 0 or 1, y and z are 0, 1, or 2, $R^{81}$ to $R^{99}$, which may be the same or different from each other, are a hydrogen atom, a halogen atom, an aliphatic hydrocarbon group which is an alkyl group having 1 to 20 carbon atoms or a cycloalkyl group having 3 to 15 carbon atoms, or an aromatic hydrocarbon group or an alkoxy group having 6 to 20 carbon atoms, the carbon atoms to which $R^{89}$ and $R^{90}$ are bonded and the carbon atoms to which $R^{93}$ is bonded or the carbon atoms to which $R^{91}$ is bonded may be directly bonded or bonded via an alkylene group having 1 to 3 carbon atoms, and when y=z=0, $R^{95}$ and $R^{92}$ or $R^{95}$ and $R^{99}$ may be bonded to each other to form a monocyclic or polycyclic aromatic ring.

[Chem. 14]

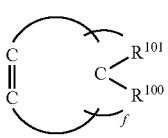

(VIIa)

In General Formula (VIIa), $R^{100}$ and $R^{101}$, which may be the same or different from each other, represent a hydrogen atom or a hydrocarbon group having 1 to 5 carbon atoms, and f is 1≤f≤18.

[Chem. 15]

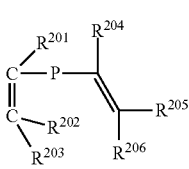

(VIIIa)

In General Formula (VIIIa), $R^{201}$ to $R^{206}$, which may be the same or different from each other, are a hydrogen atom or a hydrocarbon group having 1 to 20 carbon atoms, and P is a linear or branched hydrocarbon group having 1 to 20 carbon atoms and may include a double bond and/or a triple bond.

As specific examples of cyclic olefins represented by General Formulas (VIa) and (VIIa), it is possible to use the compounds described in paragraphs 0037 to 0063 of International Publication No. 2006/118261.

Specific examples of the chain polyene represented by General Formula (VIIIa) include 1,4-hexadiene, 3-methyl-1,4-hexadiene, 4-methyl-1,4-hexadiene, 5-methyl-1,4-hexadiene, 4,5-dimethyl-1,4-hexadiene, 7-methyl-1,6-octadiene, DMDT, 1,3-butadiene, 1,5-hexadiene, and the like. In addition, cyclizing polyenes cyclized from polyenes such as 1,3-butadiene and 1,5-hexadiene may also be used.

In a case where the cyclic olefin-based copolymer (m) includes a constituent unit derived from a chain polyene represented by General Formula (VIIIa), or a constituent unit derived from a cyclic olefins other than the cyclic non-conjugated dienes represented by General Formula (III) and the cyclic olefins represented by General Formula (V) (for example, General Formula (VIa) and General Formula (VIIa)), the content of the constituent unit is usually 0.1 to 100 mol %, and preferably 0.1 to 50 mol % with respect to the total number of moles of the repeating units derived from one or more kinds of olefins represented by General Formula (I), the repeating units derived from one or more kinds of cyclic non-conjugated dienes represented by General Formula (III), and the repeating units derived from one or more kinds of cyclic olefins represented by General Formula (V).

Using the olefin monomer represented by General Formula (I), the cyclic olefin represented by General Formula (VIa) or (VIIa), and the chain polyene represented by General Formula (VIIIa) as the copolymerization component makes it possible to obtain the effect according to the present embodiment and to further improve the solubility of the cyclic olefin-based copolymer in the solvent, thus, the moldability is good and the yield of the product is improved. Among these, cyclic olefin represented by General Formula (VIa) or (VIIa) are preferable. Since these cyclic olefins have a rigid ring structure, the modulus of elasticity of the copolymer and the cross-linked product is easily retained, and since these cyclic olefins do not include a heterogeneous double bond structure, there is an advantage in that cross-linking is easily controlled.

It is possible to control the content of the comonomer and the glass transition point (Tg) of the cyclic olefin-based copolymer (m) according to the charge ratio of the monomer depending on the desired application. The Tg of the cyclic olefin-based copolymer (m) is usually 300° C. or less, preferably 250° C. or less, more preferably 200° C. or less, even more preferably 170° C. or less, and particularly preferably 150° C. or less. When the Tg is the above upper limit value or less, the melt moldability of the cyclic olefin-based copolymer (m) and the solubility in a solvent during varnishing are improved.

[Method for Producing Cyclic Olefin-Based Copolymer (m)]

It is possible to produce the cyclic olefin-based copolymer (m) according to the present embodiment, for example, according to the method for producing a cyclic olefin-based copolymer described in paragraphs 0075 to 0219 of International Publication No. 2012/046443. The details thereof are omitted here.

[Cyclic Olefin-based Polymer (n)]

As the cyclic olefin-based polymer (n) according to the present embodiment, for example, it is possible to use the same cyclic olefin-based copolymer as described in paragraphs 0054 to 0081 of International Publication No. 2017/150218. The details thereof are omitted here.

[Maleimide Compound (L)]

Next, a description will be given of the maleimide compound (L) according to the present embodiment.

The maleimide compound (L) in the present invention is obtained from maleic anhydride and various amine compounds.

The maleimide compound (L) according to the present embodiment has a solubility parameter (SP value) obtained by Fedors method of 19 $J^{1/2}/cm^{3/2}$ or more and 26 $J^{1/2}/cm^{3/2}$ or less and includes a maleimide compound (l), which is a bismaleimide compound having at least two maleimide groups in the molecule.

By including the maleimide compound (l) of the above aspect, it is possible for the cyclic olefin-based polymer composition to be a composition in which the blending components are sufficiently dissolved while including the cyclic olefin-based polymer and the maleimide compound, and, the cyclic olefin-based polymer composition makes it possible to improve the heat resistance and mechanical strength while satisfying the dielectric characteristics in the high frequency band suitable for circuit substrates and the like, in a cross-linked product obtained by cross-linking the cyclic olefin-based polymer composition.

It is also possible to for the maleimide compound (L) according to the present embodiment to include a maleimide compound other than the maleimide compound (l). When the total amount of the maleimide compound (l) and the maleimide compound other than the maleimide compound (l) included in the cyclic olefin-based polymer composition according to the present embodiment is 100% by mass, it is possible to set the content of the maleimide compound (l), for example, to 10% by mass or more and 100% by mass or less, preferably 30% by mass or more and 100% by mass or less, and more preferably 50% by mass or more and 100% by mass or less.

In addition, when the total amount of the maleimide compound (1) and the maleimide compound other than the maleimide compound (l) included in the cyclic olefin-based polymer composition according to the present embodiment is 100% by mass, it is also possible to have a form in which the content of the maleimide compound (l) is set to 100% by mass and not to include a maleimide compound other than the maleimide compound (l).

Maleimide Compound (1)

Specific examples of the maleimide compound (l) include bisphenol A diphenyl ether bismaleimide (BMI-4000 manufactured by Daiwakasei Industry Co., LTD.), 3,3'-dimethyl-5,5'-diethyl-4,4'-diphenylmethane bismaleimide (BMI-5100 manufactured by Daiwakasei Industry Co., LTD.), 1,6'-bismaleimide-(2,2,4-trimethyl) hexane (BMI-TMH manufactured by Daiwakasei Industry Co., LTD.), BMI689 (manufactured by Designer Molecules Inc.), and the like. Among these, 3,3'-dimethyl-5,5'-diethyl-4,4'-diphenylmethanebismaleimide is particularly preferable. Two or more kinds of maleimide compound (1) may be used in combination.

As the maleimide compound (l) according to the present embodiment, for example, in a case of using a mixture (also referred to as a bismaleimide triazine resin) of a maleimide resin and a triazine resin obtained by reacting the maleimide compound (l) and a cyanate ester compound, the obtained cyclic olefin-based polymer composition has poor stability when varnished. For this reason, the bismaleimide triazine resin is not preferable as the maleimide compound (l).

The maleimide compound (l), which is a component of the composition according to the present embodiment, has a solubility parameter (SP value) of 19.0 $J^{1/2}/cm^{3/2}$ or more and 26.0 $J^{1/2}/cm^{3/2}$ or less according to the Fedors method. The solubility parameter (SP value) is 19.0 $J^{1/2}/cm^{3/2}$ or more, preferably 19.5 $J^{1/2}/cm^{3/2}$ or more, and particularly preferably 20.0 $J^{1/2}/cm^{3/2}$ or more. In addition, the solubility parameter (SP value) is 26.0 $J^{1/2}/cm^{3/2}$ or less, preferably 25.5 $J^{1/2}/cm^{3/2}$ or more, and more preferably 25.0 $J^{1/2}/cm^{3/2}$ or less.

By setting the SP value within the above numerical range, it is possible to better preserve the compatibility of each component in the cyclic olefin-based copolymer composition according to the present embodiment.

The solubility parameter SP value is a value calculated by the Fedors method (Robert F. Fedors, Polymer Engineering and Science, 14, 147-154 (1974)) and it is possible to carry out the calculation using Equation (1).

Equation (1)

$$\delta = (E/V)^{1/2} \tag{1}$$

In Equation (1), $\delta$ represents the solubility parameter (SP value), E represents the aggregation energy (J/mol), and V represents the molar volume ($cm^3$/mol).

It is possible to calculate the solubility parameter (SP value) of the maleimide compound (l) based on the documented value of the aggregation energy E (J/mol) and the molar volume V ($cm^3$/mol) of each structural unit (for example, D. W. VanKREVELEN, PROPERTIES OF POLYMERS).

The maleimide compound (l) according to the present embodiment preferably has a molecular weight of 300 or more and 1000 or less, more preferably 300 or more and 900 or less, and particularly preferably 300 or more and 700 or less.

Setting the molecular weight of the maleimide compound (l) within the above numerical range obtains a cyclic olefin-based copolymer composition capable of obtaining a crosslinked product having superior heat resistance and mechanical strength while maintaining dielectric characteristics.

A description will be given below of other components able to be included in the cyclic olefin-based copolymer resin composition according to the present embodiment.

Compatibility Agent

The cyclic olefin-based copolymer composition according to the present embodiment preferably further contains a compatibility agent (C) which compatibilizes the cyclic olefin-based copolymer (M) and the maleimide compound (L). In the present embodiment, the compatibility agent (C) is a compound which compatibilizes the cyclic olefin-based copolymer (M) and the maleimide compound (L), and in particular, a compound which compatibilizes the cyclic olefin-based copolymer (m) and the maleimide compound (l). Examples thereof include modified polyolefins, compounds provided with polar groups and unsaturated carbon bonds capable of contributing to the polymerization reaction, and the like, in the molecule. By including the compatibility agent (C), the cyclic olefin-based polymer composition according to the present embodiment is able to obtain a composition in which the blending components are sufficiently dissolved while including the cyclic olefin-based polymer and the maleimide compound.

Examples of the modified polyolefin include polyolefins obtained by grafting or graft-polymerizing a monomer having a polar group, a copolymer of an olefin and a monomer having a polar group, and the like.

Among these, polyolefins obtained by grafting a monomer having a polar group are preferable. Here, "graft" means introducing a compound having a polar group into a stem polymer which is a main chain. "Graft-polymerized" means introducing a branch polymer formed of a polymer different from the main chain into a stem polymer which is the main chain.

Examples of the polar group include an amino group, a hydroxyl group, a carboxyl group, an epoxy group, a nitrile group, a nitro group, an aldehyde group, an amide group, an ester group, and the like. These are used alone or in a combination of two or more. Among these, a carboxyl group is preferable from the viewpoint of being able to further improve the mechanical strength of the obtained cured product.

Examples of the monomer having such a polar group include acrylic acid, methacrylic acid, maleic acid, maleic anhydride, methyl methacrylate, methyl acrylate, ethyl methacrylate, ethyl acrylate, propyl methacrylate, propyl acrylate, butyl methacrylate, butyl acrylate, glycidyl acrylate, glycidyl methacrylate, allyl glycidyl ether, dimethylaminoethyl methacrylate, vinyl pyridine, t-butylaminoethyl methacrylate, acrylamide, methacrylamide, maleimide, allyl alcohol, 2-hydroxyethyl methacrylate, 2-hydroxyethyl acrylate, 2-hydroxypropyl methacrylate, 2-hydroxypropyl acrylate, oxazoline, and the like. It is possible to use the above compounds alone or in a combination of two or more kinds. Among these, acrylic acid, methacrylic acid, maleic acid, and maleic anhydride are preferable.

In addition, examples of the polyolefins include polyolefins or oligomers such as polyethylene, polypropylene, ethylene/α-olefin copolymer, styrene/butadiene block copolymer, propylene/1-butene copolymer, propylene/1-butene copolymer, propylene/α-olefin copolymer, poly-4-methylpentene, and polybutene, natural rubber, synthetic rubber such as polyisoprene rubber, polybutadiene rubber, nitrile rubber (acrylonitrile-butadiene copolymer), chloroprene rubber, butyl rubber, acrylic rubber, polyurethane elastomer, silicone rubber, ethylene-propylene copolymer, ethylene-propylene-diene copolymer, chlorosulfated polyethylene, ethylene vinyl acetate copolymer, ethylene-acrylic acid copolymer, ethylene-acrylic acid ester copolymer, chlorinated polyethylene, epichlorohydrin rubber, and nitrile isoprene rubber, elastomers such as polyester elastomer and urethane elastomer, styrene-butadiene-styrene block copolymer, styrene-isoprene-styrene block copolymer, styrene-ethylene-butylene-styrene block copolymer, styrene-ethylene-propylene-styrene block copolymer, and the like. It is possible to use these alone or in a combination of two or more.

Examples of a polyolefin grafted with such a monomer having a polar group include a maleic acid-modified polyolefin such as a hydrogenated product of a styrene/butadiene block copolymer grafted with maleic anhydride, a propylene/1-butene copolymer obtained by grafting a monomer having a polar group, and the like.

Furthermore, the compatibility agent (C) is not limited to a high molecular compound represented by the modified polyolefin as described above and it is possible to use a low molecular weight compound having no repeating unit.

As such a low molecular weight compound, a compound provided with a polar group and an unsaturated carbon bond capable of contributing to the polymerization reaction in the molecule is preferable. Examples of the polar group shown here include an amino group, a hydroxyl group, a carboxyl group, an epoxy group, a nitrile group, a nitro group, an aldehyde group, an amide group, an ester group, a glycidyl group, and the like. Among these, from the viewpoint of further improving the mechanical strength of the obtained cured product, an epoxy group and a glycidyl group are preferable.

As a compound provided with a polar group in the molecule and an unsaturated carbon bond capable of contributing to the polymerization reaction, it is preferable to use acrylic acid, methacrylic acid, or a derivative thereof from the viewpoint of availability and the like.

Examples of acrylic acid derivatives include 2-hydroxyethyl acrylate, 2-hydroxypropyl acrylate, glycidyl acrylate, acrylamide, N-cyclopropylacrylamide, N,N-dimethylacrylamide, N-hydroxymethylacrylamide, N-isopropylacrylamide, acrylonitrile, and the like.

In addition, examples of methacrylic acid derivatives include 2-hydroxyethyl methacrylate, 2-hydroxypropyl methacrylate, glycidyl methacrylate, methacrylamide, N-cyclopropylmethacrylamide, N,N-dimethylmethacrylamide, N-hydroxymethylmethacrylamide, N-isopropylmethacrylamide, methacrylonitrile, and the like.

Among these, glycidyl methacrylate is preferable from the viewpoint of further improving the mechanical strength of the obtained cross-linked product.

Examples of compounds able to be used as the compatibility agent (C) are listed above, but it is also possible to use these alone or in a combination of a plurality of kinds.

The content of the compatibility agent (C) is preferably 0.1 to 10 parts by mass when the total of the cyclic olefin-based copolymer (M) and the maleimide compound (L) in the curable resin composition is 100 parts by mass, and more preferably 2 to 5 parts by mass.

By setting the content of the compatibility agent (C) within the above numerical range, it is possible to obtain a cyclic olefin-based resin composition capable of obtaining a cross-linked product having an excellent balance of dielectric characteristics, mechanical properties, and heat resistance.

Elastomer

The cyclic olefin-based copolymer composition according to the present embodiment may further include an elastomer from the viewpoint of improving the dielectric characteristics in a high frequency band while improving the mechanical properties of the obtained cross-linked product.

From the viewpoint of further improving the dielectric characteristics in the high frequency band while improving the mechanical properties of the obtained cross-linked product when the entirety of the cyclic olefin-based copolymer composition is 100 parts by mass, the content of the elastomer is preferably 1 part by mass or more and 50 parts by mass or less.

As the elastomer, for example, it is preferable to include one or two or more kinds selected from a styrene-based elastomer, an ethylene/propylene elastomer, and a diene-based elastomer.

Examples of the styrene-based elastomer include styrene-conjugated diene block copolymer resin (conjugated dienes including butadiene, isoprene, and the like), hydrogenated products of styrene-conjugated diene block copolymer resin (conjugated dienes including butadiene, isoprene, and the like), triblock copolymer resin of styrene-conjugated diene-styrene (conjugated dienes including butadiene, isoprene, and the like), hydrogenated products of triblock copolymer resins of styrene-conjugated diene styrene (conjugated dienes including butadiene, isoprene, and the like), and the like.

Examples of the ethylene/propylene elastomer include ethylene/propylene rubber, ethylene/propylene-diene rubber, and the like.

Examples of the diene-based elastomer include polybutadiene, polyisoprene, styrene-butadiene rubber, butadiene rubber, isoprene rubber, chloroprene rubber, acrylonitrile-butadiene rubber, and the like.

Additives

Various additives may be added to the cyclic olefin-based copolymer composition according to the present embodiment according to the purpose. The amount of the additive to be added is appropriately selected within a range which does not impair the object of the present invention depending on the application.

Examples of the additives include one kind or two or more kinds of additives selected from the group consisting of heat resistant stabilizers, weathering stabilizers, radiation resistant agents, frictional abrasion characteristics-improving agents, flame retardants, foaming agents, impact resistance agents, fillers, hydrochloric acid absorbers, and metal deactivators.

Examples of heat resistant stabilizers include hindered phenol-based heat resistant stabilizers, sulfur-based heat resistant stabilizers, amine-based heat resistant stabilizers, and the like. In addition, it is also possible to use these singly or in a combination of two or more. Among these, phosphite-based heat resistant stabilizers and hindered phenol-based heat resistant stabilizers are preferable.

As examples of the additives described above, it is possible to use heat resistant stabilizers, light stabilizers, antioxidants, ultraviolet absorbers, radiation-resistant agents, plasticizers, lubricants, mold release agents, nucleating agents, frictional abrasion characteristics-improving agents, flame retardants, foaming agents, antistatic agents, colorants, antifogging agents, antiblocking agents, impact resistance agents, surface wetting improvers, fillers, hydrochloric acid absorbers, metal deactivators or the like described in paragraphs 0085 to 0120 of International Publication No. 2017/150218.

(Method for Preparing Cyclic Olefin-Based Copolymer Composition)

In the method for preparing the cyclic olefin-based copolymer composition according to the present embodiment, it is possible to carry out the preparation by mixing a cyclic olefin-based copolymer (M), a maleimide compound (L), and, as necessary, an elastomer and various additives. As the mixing method, it is possible to adopt a method of melt-blending with an extruder or the like, a solution blending method of dissolving and dispersing in an appropriate solvent, and the like.

A detailed description will be given below of the solvent.

[Varnish]

The varnish according to the present embodiment is able to contain the cyclic olefin-based copolymer composition described above and a solvent.

The solvent is preferably formed of a mixed solvent including at least one non-polar solvent (X) and at least one polar solvent (Y).

Examples of the non-polar solvent (X) include saturated hydrocarbons such as heptane, hexane, octane, and decane; alicyclic hydrocarbons such as cyclohexane, methylcyclohexane, and decahydronaphthalene; aromatic hydrocarbons such as toluene, benzene, xylene, mesitylene, and pseudocumene.

Examples of the polar solvent (Y) include alcohols such as methanol, ethanol, isopropyl alcohol, butanol, pentanol, hexanol, propanediol, and phenol; ketone-based solvents such as acetone, methyl isobutyl ketone, methyl ethyl ketone, pentanone, hexanone, cyclohexanone, isophorone, and acetophenone; cellosolves such as methyl cellosolve and ethyl cellosolve; esters such as methyl acetate, ethyl acetate, butyl acetate, methyl propionate, and butyl formate; and halogenated hydrocarbons such as trichloroethylene, dichloroethylene, and chlorobenzene.

The non-polar solvent (X) preferably includes at least one selected from toluene, xylene, cyclohexane, and decalin and the polar solvent (Y) preferably includes at least one selected from methyl isobutyl ketone, methyl ethyl ketone, diisobutyl ketone, methyl propyl ketone, and cyclohexanones.

Among these, from the viewpoint of long-term stability, solubility, and versatility of the varnish, a form in which at least toluene is included as the non-polar solvent (X) and at least methyl isobutyl ketone is included as the polar solvent (Y) is more preferable, and a mixed solvent of toluene and methyl isobutyl ketone is particularly preferable.

In addition, when the total amount of the non-polar solvent (X) and the polar solvent (Y) is 100% by mass, it is preferable that the content of the non-polar solvent (X) is 70% by mass or more and 95% by mass or less and the content of the polar solvent (Y) is 5% by mass or more and 30% by mass or less.

By setting the blending ratio of the non-polar solvent (X) and the polar solvent (Y) within the above numerical range, it is possible to obtain a varnish having more stability and with excellent solubility of the blended components.

In the present embodiment, the method for producing the varnish may carry out the preparation by any method, but usually includes a step of mixing the cyclic olefin-based copolymer composition and the solvent. The order of the components in the mixing of the respective components is not limited and the mixing is able to be carried out by any method such as in batches or separately. The apparatus for preparing the varnish is also not limited and the preparation may be carried out by any batch type or continuous type apparatus capable of stirring and mixing. It is possible to arbitrarily select the temperature when preparing the varnish within a range from room temperature to the boiling point of the solvent.

The varnish may be prepared by directly using the reaction solution obtained when the cyclic olefin-based copolymer (m) is obtained as a solvent and dissolving the cyclic olefin-based polymer (n) therein. In addition, the varnish may be prepared by mixing the varnish of the separately prepared cyclic olefin-based polymer (n) with the reaction solution when the cyclic olefin-based copolymer (m) is obtained.

[Production Method of Cross-Linked Product (Q)]

The cross-linked product (Q) is a cross-linked product of the cyclic olefin-based copolymer composition according to the present embodiment and is obtained by cross-linking the cyclic olefin-based copolymer (M) in the cyclic olefin-based copolymer composition described above. The method for cross-linking the cyclic olefin-based copolymer (M) is not particularly limited, but examples thereof include a method of cross-linking while molding or after molding into an arbitrary shape using a radical polymerization initiator, sulfur, a hydrosilyl group-containing compound, or electron beams or other radiation, or the like.

When cross-linking with a radical polymerization initiator, it is possible to directly apply a cross-linking method using a normal radical polymerization initiator applied using a polyolefin. That is, a radical polymerization initiator such as dicumyl peroxide is blended into the cyclic olefin-based copolymer composition, heated, and subjected to cross-linking. The blending ratio of the radical polymerization initiator is not particularly limited, but is usually 0.02 to 20 parts by mass per 100 parts by mass of the cyclic olefin-based copolymer (m), preferably 0.05 to 10 parts by mass, and even more preferably 0.5 to 10 parts by mass. When the blending ratio of the radical polymerization initiator is the above upper limit value or less, it is possible to improve the dielectric characteristics of the cross-linked product (Q), and when the above lower limit value or more, it is possible to improve the heat resistance and mechanical properties of the cross-linked product (Q).

As the radical polymerization initiator, it is possible to use known thermal radical polymerization initiators or photo radical polymerization initiators, or combinations thereof. Among these radical polymerization initiators, in a case where a thermal radical polymerization initiator is used, the 10-hour half-life temperature is usually 80° C. or higher, and preferably 120° C. or higher from the viewpoint of storage stability. Examples of such initiators include dialkyl peroxides such as dicumyl peroxide, t-butyl cumyl peroxide, 2,5-bis(t-butylperoxy) 2,5-dimethylhexane, 2,5-bis(t-butylperoxy) 2,5-dimethyl hexyne-3, di-t-butyl peroxide, isopropylcumyl-t-butyl peroxide, and bis(α-t-butylperoxy isopropyl)benzene; peroxy ketals such as 1,1-bis(t-butylperoxy) cyclohexane, 1,1-bis(t-butylperoxy) 3,3,5-trimethylcyclohexane, 1,1-bis(t-butylperoxy)cyclododecane, n-butyl-4,4-bis(t-butylperoxy) valerate, ethyl 3,3-bis(t-butylperoxy) butyrate, 3,3,6,6,9,9-hexamethyl-1,2,4,5-tetraoxacyclononane; peroxy esters such as bis(t-butylperoxy) isophthalate, t-butylperoxybenzoate, and t-butylperoxyacetate; hydroperoxides such as t-butyl hydroperoxide, t-hexyl hydroperoxide, cumin hydroperoxide, 1,1,3,3-tetramethylbutyl hydroperoxide, diisopropylbenzene hydroperoxide, and p-menthane hydroperoxide; bibenzyl compounds such as 2,3-dimethyl-2,3-diphenylbutane; 3,3,5,7,7-pentamethyl-1,2,4-trioxepane, and the like.

Specific examples of photo radical polymerization initiators in the radical polymerization initiators include benzoin alkyl ether, benzyl dimethyl ketal, 1-hydroxycyclohexyl phenyl ketone, 2-hydroxy-2-methyl-1-phenylpropane-1-on, benzophenone, methylbenzoylformate, isopropylthioxanthone, mixtures of two or more kinds thereof, and the like. In addition, it is also possible to use sensitizers together with these photo radical polymerization initiators. Examples of sensitizers include carbonyl compounds such as anthraquinone, 1,2-naphthoquinone, 1,4-naphthoquinone, benzanthrone, p,p'-tetramethyldiaminobenzophenone, and chloranil, nitro compounds such as nitrobenzene, p-dinitrobenzene, and 2-nitrofluorene, aromatic hydrocarbons such as anthracene and chrysene, sulfur compounds such as diphenyldisulfide, nitrogen compounds such as nitroaniline, 2-chloro-4-nitroaniline, 5-nitro-2-aminotoluene, and tetracyanoethylene, and the like.

In a case of cross-linking with sulfur or the like, the cyclic olefin-based copolymer composition is blended with a sulfur-based compound, and, as necessary, a vulcanization accelerator and a vulcanization acceleration aid, and heated to perform a cross-linking reaction. Although the blending amount of the sulfur-based compound is not particularly limited, in terms of efficiently advancing the cross-linking reaction, improving the physical properties of the obtained cross-linked product, economy, and the like, the sulfur-based compound is usually used in a range of 0.1 to 10 parts by mass with respect to 100 parts by mass of the cyclic olefin-based copolymer (m) and preferably in the range of 0.3 to 5 parts by mass, and in a case of being used together with a vulcanization accelerator or a vulcanization acceleration aid, usually in a range of 0.1 to 20 parts by mass and preferably 0.2 to 10 parts by mass.

It is possible to use various known sulfur-based compounds to cause the cross-linking reaction and examples thereof include sulfur, sulfur monochloride, sulfur dichloride, morpholine disulfide, alkylphenol disulfide, tetramethylthiuram disulfide, selenium dimethyldithiocarbamate, and the like. In addition, it is also possible to use various kinds of vulcanization accelerators and examples thereof include thiazole-based kinds such as N-cyclohexyl-2-benzothiazole-sulfenamide, N-oxydiethylene-2-benzothiazole-sulfenamide, N,N-diisopropyl-2-benzothiazole-sulfenamide, 2-mercaptobenzothiazole, 2-(2,4-dinitrophenyl)mercaptobenzothiazole, 2-(2,6-diethyl-4-morpholinothio)benzothiazole, and benzothiazyl-disulfide; guanidine-based kinds such as diphenyl guanidine, triphenyl guanidine, di-ortho-tolyl guanidine, ortho-tolyl biguanide, and diphenyl guanidine phthalate; acetaldehyde-aniline reaction product; butyraldehyde-aniline condensate; aldehyde amine or aldehyde ammonia-based kinds such as hexamethylenetetramine and acetaldehyde ammonia; imidazoline-based kinds such as 2-mercaptoimidazoline; thiourea-based kinds such as thiocarbanilide, diethyl thiourea dibutyl thiourea, trimethyl thiourea, and diortho-tolyl thiourea; thiuram-based kinds such as tetramethyl thiuram monosulfide, tetramethylthiuram disulfide, tetraethylthiuram disulfide, tetrabutylthiuram disulfide, and dipentamethylenethiuram tetrasulfide; dithio acid salt-based kinds such as zinc dimethyldithiocarbamate, zinc diethylthiocarbamate, zinc di-n-butyldithiocarbamate, zinc ethylphenyldithiocarbamate, zinc butylphenyldithiocarbamate, sodium dimethyldithiocarbamate, selenium dimethyldithiocarbamate, and tellurium diethyldithiocarbamate; xanthate-based kinds such as zinc dibutyl xanthate; and the like. Examples of vulcanization acceleration aids include metal oxide-based kinds such as zinc oxide, activated zinc oxide, zinc carbonate, complex zinc oxide, magnesium oxide, litharge, red lead, and basic lead carbonate, fatty acid-based kinds such as stearic acid, oleic acid, lauric acid, and lead stearate, organic amine glycol-based kinds such as triethanol amine, and diethylene glycol, and the like.

The temperature at which the cyclic olefin-based copolymer composition is cross-linked by both radical polymerization initiator cross-linking and sulfur cross-linking is usually 100 to 300° C., preferably 120 to 250° C., and more preferably 120 to 220° C., and the cross-linking may be carried out by changing the temperature in stages. When the temperature is the above lower limit value or more, it is possible for the cross-linking to proceed sufficiently. In addition, when the temperature is the above upper limit value or less, it is possible to suppress coloration of the obtained cross-linked product and to simplify the process. As a reference, it is generally not possible for polybutadiene, which is a typical double bond-containing polymer, to be cross-linked under the conditions as described above and cross-linking conditions at high temperature such as 300° C. are necessary.

It is also possible for the cyclic olefin-based copolymer composition according to the present embodiment to be cross-linked using a hydrosilyl group-containing compound having at least two hydrosilyl groups in one molecule. It is possible to carry out cross-linking using a hydrosilyl group-containing compound, for example, according to the method described in Japanese Unexamined Patent Publication No. 2015-193680. The details are omitted here.

Methods of cross-linking using electron beams or other radiation have the advantage of not limiting the temperature and fluidity at the time of molding and examples of radiation include electron beams, gamma rays, UV, and the like.

In either case of a method using a radical polymerization initiator, sulfur, a hydrosilyl group-containing compound, or the like, or a method of cross-linking using radiation, it is possible to carry out the cross-linking with a cross-linking aid.

The cross-linking aid is not particularly limited and examples thereof include oximes such as p-quinonedioxime and p, p'-dibenzoylquinonedioxime; acrylates or methacrylates such as ethylene dimethacrylate, polyethylene glycol dimethacrylate, trimethylolpropane trimethacrylate, cyclohexyl methacrylate, acrylic acid/zinc oxide mixture, and allyl methacrylate; vinyl monomers such as divinylbenzene, vinyltoluene, and vinylpyridine; allyl compounds such as hexamethylene diallyl nadiimide, diallyl itaconate, diallyl phthalate, diallyl isophthalate, diallyl monoglycidyl isocyanurate, triallyl cyanurate, and triallyl isocyanurate; maleimide compounds such as N,N'-m-phenylene bismaleimide and N,N'-(4,4'-methylene diphenylene)dimaleimide, cyclic non-conjugated dienes such as vinyl norbornene, ethylidene norbornene, and dicyclopentadiene. These cross-linking aids may be used alone or use in combination is also possible.

It is also possible for the cross-linking reaction to be carried out on a mixture of the cyclic olefin-based copolymer composition and a compound such as the above radical polymerization initiator, sulfur, hydrosilyl group-containing compound or the like in a molten state, it is also possible for the cross-linking reaction to be carried out on the mixture in a dissolved state of being dissolved or dispersed in a solvent, or it is also possible for the cross-linking reaction to be further advanced after volatilizing the solvent from a dissolved state dissolved in a solvent to mold an arbitrary shape such as a film or a coating.

In a case where the reaction is carried out in the molten state, the raw material mixture is melt-kneaded and reacted using a kneading apparatus such as a mixing roll, a Banbury mixer, an extruder, a kneader, or a continuous mixer. In addition, it is also possible to further advance the cross-linking reaction after molding by an arbitrary method.

As a solvent to be used for carrying out the reaction in a dissolved state, it is possible to use the same solvent as used in the solution blending method.

In a case where the cross-linking reaction is carried out using electron beams, other radiation, or UV, it is possible for the reaction to be carried out after shaping by an arbitrary method.

[Film or Sheet]

It is possible for the cross-linked product of the cyclic olefin-based copolymer composition according to the present embodiment to be molded into a film or sheet and used for various purposes. As a method of forming a film or a sheet using the cyclic olefin-based copolymer composition according to the present embodiment, it is possible to apply various known methods. Examples thereof include a method in which the varnish described above is coated on a support base material such as a thermoplastic resin film, dried, and then subjected to a heat treatment or the like to cross-link the cyclic olefin-based copolymer composition. The method of coating the varnish on the support base material is not particularly limited, but examples thereof include coating using a spin coater, coating using a spray coater, coating using a bar coater, and the like.

In addition, examples thereof also include a method of melt-molding the cyclic olefin-based copolymer composition according to the present embodiment to obtain a film or sheet.

[Laminate]

It is possible to use the film or sheet according to the present embodiment for various purposes as a laminate by laminating the film or sheet on a base material. As a method for forming the laminate according to the present embodiment, it is possible to apply various known methods.

For example, it is possible to produce a laminate by laminating a film or sheet manufactured by the method described above on a base material and carrying out heating and curing by pressing or the like as necessary.

In addition, it is also possible to produce a laminate by laminating an electrically insulating layer including the cross-linked product described above on a conductor layer.

[Multi-Layer Formed Article or Multi-Layer Laminated Film]

The cyclic olefin-based copolymer composition according to the present embodiment may be formed on the surface layers of various multi-layer formed articles or multi-layer laminated films. At this time, the resin layer formed from the cyclic olefin-based copolymer composition is preferably 100 μm or less.

Examples of the various multi-layer formed articles or multi-layer laminated films include multi-layer formed articles for optical lenses in which the cyclic olefin-based copolymer composition of the present embodiment is formed on the surface of a resin optical lens, multi-layer gas barrier films formed of the cyclic olefin-based copolymer composition of the present embodiment for imparting gas barrier properties to a resin film surface such as a PET film or a PE film and the like.

[Prepreg]

In addition, the prepreg according to the present embodiment is formed by combining the cyclic olefin-based copolymer composition according to the present embodiment and the sheet-like fiber base material.

The method for producing the prepreg is not particularly limited and it is possible to apply various known methods. Examples thereof include a method including a step of impregnating the varnish described above into a sheet-like fiber base material to obtain an impregnated body and a step of heating the obtained impregnated body and drying the solvent included in the varnish.

It is possible to carry out the impregnation of the varnish into the sheet-like fiber base material, for example, by coating a predetermined amount of varnish on the sheet-like fiber base material by a known method such as spray coating, dip coating, roll coating, curtain coating, die coating, and slit coating, overlaying a protective film thereon as necessary, and carrying out pressing with a roller or the like thereon from the upper side.

In addition, the step of heating the impregnated body and drying the solvent included in the varnish described above is not particularly limited and examples thereof include a method such as batchwise drying in air or nitrogen with a blower dryer or drying by heating in a heating furnace in a subsequent step.

In the present embodiment, after the varnish is impregnated into the sheet-like fiber base material, the obtained impregnated body is heated to a predetermined temperature to evaporate the solvent included in the varnish to obtain a prepreg.

As the fibers of the sheet-like fiber base material according to the present embodiment, it is possible to use inorganic and/or organic fibers without particular limitation and examples thereof include organic fibers such as polyethylene terephthalate (PET) fibers, aramid fibers, ultra-high molecular polyethylene fibers, polyamide (nylon) fibers, and liquid crystal polyester fibers; inorganic fibers such as glass fibers, carbon fibers, alumina fibers, tungsten fibers, molybdenum fibers, titanium fibers, steel fibers, boron fibers, silicon carbide fibers, and silica fibers; and the like. Among these, organic fibers and glass fibers are preferable, and aramid fibers, liquid crystal polyester fibers, and glass fibers are particularly preferable. Examples of glass fibers include E glass, NE glass, S glass, D glass, H glass, T glass, and the like.

Impregnation of the varnish into the sheet-like fiber base material is carried out, for example, by immersion and coating. The impregnation may be repeated a plurality of times as necessary.

These sheet-like fiber base materials are able to be used singly or in a combination of two or more and the usage amount of the sheet-like fiber base material is appropriately selected according to demands, but it is usually in a range of 10 to 90% by mass in the prepreg or laminate, preferably 20 to 80% by mass, and more preferably 30 to 70% by mass. Within this range, the dielectric characteristics and the mechanical strength of the obtained laminate are highly balanced, which is preferable.

The thickness of the prepreg according to the present embodiment is appropriately selected according to the purpose of use, but is usually 0.001 to 10 mm, preferably 0.005 to 1 mm, and more preferably 0.01 to 0.5 mm. Within this range, the shaping properties at the time of lamination and the properties such as mechanical strength and toughness of the laminate obtained by curing are sufficiently exhibited, which is preferable.

[Circuit Substrate]

As described above, the cyclic olefin-based copolymer composition according to the present embodiment is excellent in dielectric characteristics, heat resistance, mechanical properties and the like, and is thus able to be suitably used for a circuit substrate.

It is possible to adopt generally known methods as a method for producing the circuit substrate without particular limitation, for example, a film, a sheet, or a prepreg produced by the method described above is heated and cured by a lamination press or the like to form an electrically insulating layer. Next, conductor layers are laminated on the obtained electrically insulating layer by a known method to produce a laminate. Thereafter, it is possible to obtain a circuit substrate by circuit processing the conductor layer in the laminate or the like.

It is possible to use metals such as copper, aluminum, nickel, gold, silver, stainless steel, or the like as the metal for the conductor layer. Examples of the method for forming the conductor layer include a method in which the metal is formed into a foil or the like and thermally fused onto the electrically insulating layer, a method in which a metal is formed into a foil or the like and bonded to the electrically insulating layer using an adhesive, a method of forming a conductor layer formed of the metal on an electrically insulating layer by a method such as sputtering, vapor deposition, or plating, and the like. As the form of the circuit substrate, either a single-sided board or a double-sided board may be used.

It is possible to use such a circuit substrate as an electronic device, for example, by mounting electronic parts such as semiconductor elements thereon. It is possible to produce electronic devices based on known information.

Examples of such electronic devices include ICT infrastructure equipment such as servers, routers, supercomputers, mainframes, and workstations; antennas such as GPS antennas, antennas for radio base stations, millimeter wave antennas, and RFID antennas; communication devices such as mobile phones, smartphones, PHSs, PDAs, and tablet terminals; digital devices such as personal computers, televisions, digital cameras, digital video cameras, POS terminals, wearable terminals, and digital media players; vehicle-mounted electronic devices such as electronic control system devices, vehicle-mounted communication devices, car navigation devices, millimeter wave radars, and in-vehicle camera modules; semiconductor testing devices, high-frequency measurement devices, and the like; and the like.

[Foamed Product]

In addition, it is possible to obtain a foamed product by cross-linking and foaming the cyclic olefin-based copolymer composition according to the present embodiment. At this time, the foaming agent described above may be added to the cyclic olefin-based copolymer composition.

[Uses]

Since the cyclic olefin-based copolymer (m), the cyclic olefin-based copolymer composition, and the cross-linked product (Q) according to the present embodiment are excellent in solvent resistance, heat resistance, mechanical strength, and transparency, the formed article formed of the cross-linked product is able to be used for applications such as optical fibers, optical waveguides, optical disc substrates, optical filters, lenses, optical adhesives, PDP optical filters, coating materials for organic EL, base film base materials for solar cells in the aerospace field, coating materials for solar cells and thermal control systems, semiconductor elements, light emitting diodes, and electronic elements such as various types of memory, a hybrid IC, an MCM, a circuit substrate, or a prepreg or a laminate used for forming an insulating layer of a circuit substrate, overcoat materials or an interlayer insulating materials for display components or the like, substrates for liquid crystal displays or solar cells, medical instruments, members for automobiles, mold releasing agents, resin modifiers, transparent substrates for displays, members for lithium-ion batteries, semiconductor process members, film capacitors, gas barrier coating materials, electric wire coating materials, automobile members, aerospace members, process materials for semiconductors, wire coating materials, members for lithium-ion batteries, members for fuel cells, capacitor films, flexible display members, anchor coat materials, transparent adhesives, modified materials, cross-linking aids, medical containers, medical catheter members, waterproof sealing materials, releasing materials, hard coat materials, and foam modifiers.

In particular, since the present invention is excellent in the stability over time of the dielectric characteristics and is also excellent in solvent resistance, heat resistance, transparency, mechanical properties, and the like, it is possible to suitably use the present invention for high frequency applications such as high frequency circuit substrates. Furthermore, since the present invention is excellent in the gas barrier property, it is possible to suitably use the present invention as a substrate, film, or sheet of a liquid crystal display or solar cell.

Although the embodiments of the present invention are described above, these are examples of the present invention and it is also possible to adopt various configurations other than those described above.

In addition, the present invention is not limited to the above-described embodiments and variations, improvements, and the like within the scope of achieving the object of the present invention are included in the present invention.

Examples

A more detailed description will be given below of the present invention with reference to Synthesis Examples and Examples, but the present invention is not limited in any way thereby.

The compositions of the cyclic olefin-based copolymer (m) used in the Synthesis Examples, the Examples, and the Comparative Examples were measured by the methods described below.

Composition: The $^1$H-NMR measurement was carried out to calculate the cyclic non-conjugated diene content from the strength of the peaks derived from hydrogen directly bonded to the double bond carbon and the other hydrogen peaks.

The formed articles (films) obtained in the Examples and Comparative Examples were evaluated by the following method.

Evaluation of dielectric loss tangent: The films obtained in Examples and Comparative Examples were evaluated for dielectric loss tangent at 10 GHz by the cylindrical cavity resonator method.

The following raw materials were used for the experiment.

Transition Metal Compound (1):

Synthesized by the method described in Japanese Unexamined Patent Publication No. 2004-2331965.

[Chem. 16]

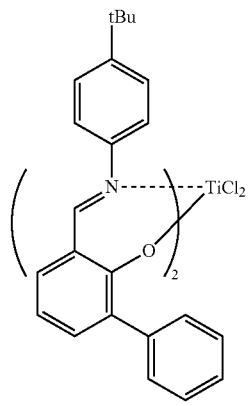

Transition metal compound (1)

MMAO (manufactured by Tosoh Finechem Corp.)
Toluene (manufactured by Wako Pure Chemical Industries, Ltd.: Wako Special Grade)
5-vinyl-2-norbornene (manufactured by Tokyo Chemical Industry Co., Ltd.)

Tetracyclo[4.4.0.1$^{2,5}$.1$^{7,10}$]-3-dodecene (manufactured by Mitsui Chemicals, Inc.)

Acetone (manufactured by Wako Pure Chemical Industries, Ltd.: Wako Special Grade)

Methanol (manufactured by Wako Pure Chemical Industries, Ltd.: Wako Special Grade)

Maleimide Compound (1):

1-1: Bismaleimide compound represented by Formula (1-1) (manufactured by Daiwakasei Industry Co., LTD., BMI-5100)

[Chem. 17]

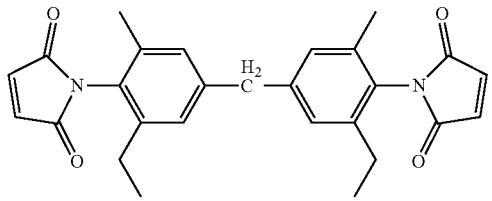

(I-1)

[Chem. 18]

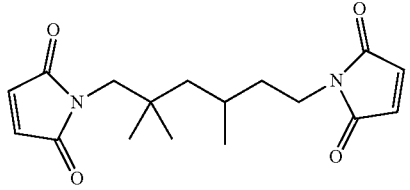

(I-2)

1-2: Bismaleimide compound represented by Formula (1-2) (manufactured by Daiwakasei Industry Co., LTD., BMI-TMH)

1-3: Bismaleimide compound represented by Formula (1-3) (manufactured by Daiwakasei Industry Co., LTD. BMI-1000)

[Chem. 19]

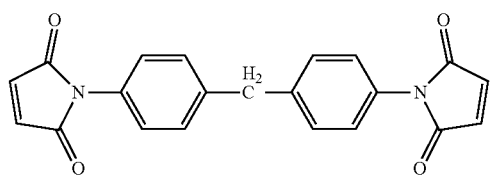

(I-3)

1-4: Bismaleimide compound represented by Formula (1-4) (manufactured by DESIGNER MOLECURES Inc., BMI-3000, number average molecular weight Mn3000)

[Chem. 20]

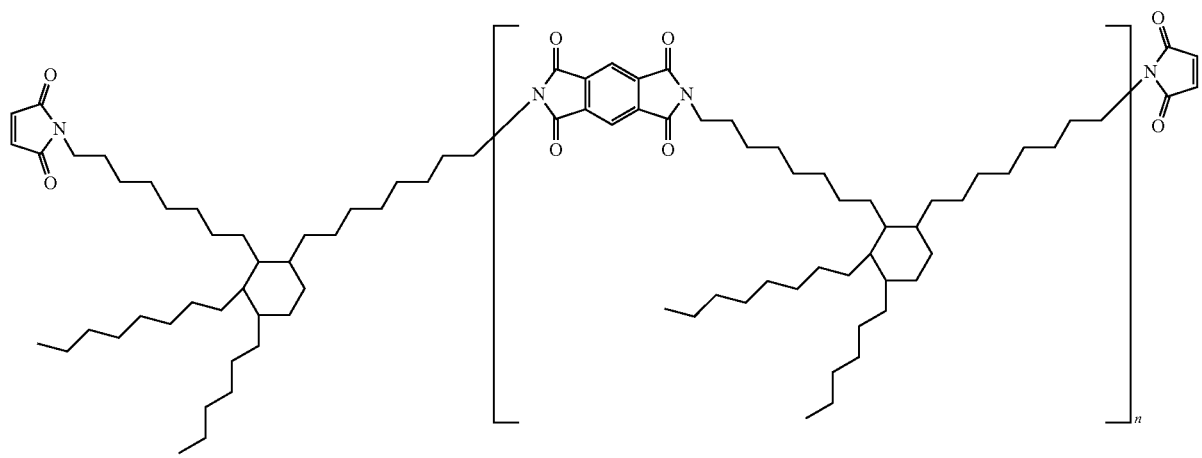

(I-4)

(In the formula, n is a number in the range of 1 to 20.)

1-5: Bismaleimide compound represented by Formula (1-4) (manufactured by DESIGNER MOLECURES Inc., BMI-5000, number average molecular weight Mn5000)

Radical Polymerization Initiator:

Cross-linking agent 1: Percumyl D (manufactured by NOF Corp.)

Cyclic Olefin-Based Copolymer (m):

Synthesis Example 1 (Cyclic Olefin-Based Copolymer (m-1) (Mn=11,900))

380 mL of toluene, 94 ml of 5-vinyl-2-norbornene (also referred to below as VNB), 26 ml of tetracyclo [4.4.0.1$^{2,5}$.1$^{7,10}$]-3-dodecene (also referred to below as TD), 1.5 mmol of a toluene solution of MMAO (manufactured by Tosoh Finechem Corporation) in terms of Al, and 868 ml of hydrogen were inserted in a sufficiently nitrogen-substituted SUS autoclave having an internal volume of 1 L, and then ethylene was introduced into the system until the total pressure reached 0.78 MPa. After adding 33 µmol of the transition metal compound (1) dissolved in toluene and polymerizing at 35° C. for 180 minutes, the obtained polymer solution was introduced to an acetone/methanol (=3/1) mixed solvent to which 0.1 vol % concentrated hydrochloric acid was added and a polymer was precipitated, stirred, and then filtered through a filter paper. The obtained solid was dried under reduced pressure at 80° C. for 10 hours to obtain an ethylene/TD/VNB copolymer. The composition ratio of the VNB-derived structure in the polymer determined by NMR was 35.9 mol %, the composition ratio of the TD-derived structure was 6.5 mol %, and the number average molecular weight (Mn) determined by GPC measurement was 11,900.

Number Average Molecular Weight (Mn)

The number average molecular weight (Mn) of the cyclic olefin-based copolymer (m) was measured by GPC measurement and determined as a standard polystyrene-equivalent value. GPC measurement was performed under the following conditions.

Apparatus: GPC HLC-8321 (manufactured by Tosoh Corporation)
Solvent: o-dichlorobenzene
Column: TSKgel GMH6-HT×2, TSKgel GMH6-HTL×2 (both manufactured by Tosoh Corporation)
Flow velocity: 1.0 ml/min
Sample: 1 mg/mL o-dichlorobenzene solution
Temperature: 140° C.

Compatibility Agent (C-1):

Synthesis Example 2: Synthesis of Maleic Anhydride-Modified Polystyrene/Polybutadiene/Polystyrene Triblock Copolymer (Compatibility Agent (C-1))

105 g of a polystyrene/polybutadiene/polystyrene triblock copolymer hydrogenated product (manufactured by Shell Chemical Co., Ltd., Kraton G1652, number average molecular weight: $8.5 \times 10^4$, styrene content: 30% by mass) and 340 ml of dehydrated toluene were added to a glass autoclave with a capacity of 1.0 L provided with a stirring blade and heated to 165° C. to carry out dissolution. Subsequently, a solution in which 3.46 g of maleic anhydride was dissolved in 40 ml of dehydrated toluene and a solution in which 0.31 g of di-t-butyl peroxide was dissolved in 40 ml of dehydrated toluene were prepared, and both solutions were added by dropping sequentially over 4 hours. After completion of the dropping, the reaction was performed at 165° C. for 2 hours.

When the amount of maleic anhydride graft of the obtained modified copolymer was measured by oxygen analysis, the amount was 3.5% by mass.

Example 1

(Preparation of Varnish 1)

Using the cyclic olefin-based copolymer (m-1) obtained in Synthesis Example 1, a cross-linking agent 1 as a radical polymerization (cross-linking) initiator, and toluene and methyl isobutyl ketone (MIBK) as a solvent, weighing was carried out according to the blending composition in Table 1. The weighed sample was placed in a 200 ml separable flask and stirred with a stirring blade at a rotation speed of 200 rpm for 4 hours to obtain a desired varnish-like cyclic olefin-based copolymer composition. The unit of the blending ratio of each raw material in Table 1 is parts by mass.

(Compatibility of Cyclic Olefin-Based Copolymer Composition)

When a film formed of a varnish-like cyclic olefin-based copolymer composition and a cyclic olefin-based polymer composition was prepared by the above method, the state of the varnish and the film was visually observed, and the compatibility of each blending component was evaluated based on the following criteria.

O: No insoluble component was generated in the varnish and the appearance of the film was uniform.

X: Insoluble components were generated in the varnish and the appearance of the film was non-uniform.

(Film Formation)

The obtained varnish-like cyclic olefin-based copolymer composition was coated onto a release-treated PET film at a rate of 10 mm/sec and then dried at 150° C. for 4 minutes in a blower dryer under a nitrogen stream. Two of the obtained films were overlaid, pressed to 3.5 MPa by vacuum pressing, heated from room temperature (25° C.) at a constant rate, and held at 180° C. for 120 minutes to obtain a laminated film. The obtained laminated film was evaluated with regard to the glass transition temperature Tg, storage elastic modulus, and dielectric loss tangent. The obtained results are shown in Table 1.

(Evaluation of Storage Elastic Modulus E' and Glass Transition Temperature Tg)

The solid viscoelastic temperature dispersion of the film obtained under the following conditions was measured and the storage elastic modulus E' at 290° C. and the glass transition temperature Tg were evaluated. The Tg was the peak temperature of tan δ.

Apparatus: RSA-III (manufactured by TA Instruments)
Deformation mode: Tensile
Temperature increase rate: 3° C./min
Frequency: 1 Hz
Setting distortion: 0.1%
Environment: Under a nitrogen atmosphere Examples 2 to 7 and Comparative Examples 1 to 2

Films were each produced in the same manner as in Example 1 except that the blending compositions were changed as shown in Table 1, and each film was evaluated. The obtained results are shown in Table 1.

In Comparative Example 2, since it was not possible to obtain a uniform cyclic olefin-based copolymer composition and it was difficult to produce a film, the glass transition temperature Tg, the storage elastic modulus, and the dielectric loss tangent were not evaluated.

TABLE 1

| Raw material | | Molecular weight | SP value (Fedors) [$J^{1/2}/cm^{3/2}$] | Example 1 | Example 2 | Example 3 | Example 4 | Example 5 |
|---|---|---|---|---|---|---|---|---|
| Cyclic olefin-based copolymer (m) | m − 1 (E/TD/VNB = 57.7/6.5/35.9) | 11900 | — | 90 | 80 | 80 | 80 | 80 |
| Maleimide compound (l) | l-1 | 442.52 | 24.6 | 10 | 20 | 20 | 0 | 0 |
| | l-2 | 318.37 | 23.1 | 0 | 0 | 0 | 20 | 0 |
| | l-3 | 358.35 | 26.7 | 0 | 0 | 0 | 0 | 0 |
| | l-4 | Mn = 3000 | 21.2 | 0 | 0 | 0 | 0 | 20 |
| | l-5 | Mn = 5000 | 21.2 | 0 | 0 | 0 | 0 | 0 |
| Compatibility agent | | C-1 | | 0 | 0 | 3 | 0 | 0 |
| Radical polymerization initiator | | Cross-linking agent 1 | | 2.1 | 2.1 | 2.1 | 2.1 | 2.1 |
| Solvent | | Toluene | | 320 | 320 | 320 | 320 | 400 |
| | | Methylisobutylketone (MIBK) | | 80 | 80 | 80 | 80 | 0 |
| Property evaluation of resin composition | | | | | | | | |
| Compatibility | | | | ○ | ○ | ○ | ○ | ○ |
| Property evaluation of molded product | | | | | | | | |
| Tg | | | [° C.] | 180 | 193 | 204 | 184 | 171 |
| Storage elastic modulus (290° C.) | | | [Pa] | 1.7 × 10$^8$ | 3.2 × 10$^8$ | 2.1 × 10$^8$ | 2.4 × 10$^8$ | 8.6 × 10$^7$ |
| Dielectric loss tangent (10 GHz) | | | — | 0.007 | — | — | 0.005 | 0.004 |

| Raw material | | Molecular weight | SP value (Fedors) [$J^{1/2}/cm^{3/2}$] | Example 6 | Example 7 | Comparative Example 1 | Comparative Example 2 |
|---|---|---|---|---|---|---|---|
| Cyclic olefin-based copolymer (m) | m − 1 (E/TD/VNB = 57.7/6.5/35.9) | 11900 | — | 50 | 80 | 100 | 80 |
| Maleimide compound (l) | l-1 | 442.52 | 24.6 | 0 | 0 | 0 | 0 |
| | l-2 | 318.37 | 23.1 | 0 | 0 | 0 | 0 |
| | l-3 | 358.35 | 26.7 | 0 | 0 | 0 | 20 |
| | l-4 | Mn = 3000 | 21.2 | 50 | 0 | 0 | 0 |
| | l-5 | Mn = 5000 | 21.2 | 0 | 20 | 0 | 0 |
| Compatibility agent | | C-1 | | 0 | 0 | 0 | 3 |
| Radical polymerization initiator | | Cross-linking agent 1 | | 2.1 | 2.1 | 2.1 | 2.1 |
| Solvent | | Toluene | | 400 | 400 | 400 | 320 |
| | | Methylisobutylketone (MIBK) | | 0 | 0 | 0 | 80 |
| Property evaluation of resin composition | | | | | | | |
| Compatibility | | | | ○ | ○ | — | X |
| Property evaluation of molded product | | | | | | | |
| Tg | | | [° C.] | 136 | 179 | 186 | — |
| Storage elastic modulus (290° C.) | | | [Pa] | 1.9 × 10$^7$ | 7.6 × 10$^7$ | 9.9 × 10$^7$ | — |
| Dielectric loss tangent (10 GHz) | | | — | 0.003 | 0.004 | 0.006 | — |

This application claims priority based on Japanese Application Japanese Patent Application No. 2018-221022 filed on Nov. 27, 2018, and the entirety of the disclosure is incorporated herein.

The invention claimed is:
1. A cyclic olefin-based copolymer resin composition comprising:
a cyclic olefin-based copolymer (M); and
a maleimide compound (L)
wherein the cyclic olefin-based copolymer (M) includes a cyclic olefin-based copolymer (m) including
a repeating unit derived from one or more kinds of olefins represented by General Formula (I),
a repeating unit derived from one or more kinds of cyclic non-conjugated dienes represented by General Formula (III), and
a repeating unit derived from one or more kinds of cyclic olefins represented by General Formula (V),
the maleimide compound (L) has a solubility parameter (SP value) obtained by Fedors method of 19 $J^{1/2}/cm^{3/2}$ or more and 26 $J^{1/2}/cm^{3/2}$ or less and includes a maleimide compound which is a bismaleimide compound having at least two maleimide groups in a molecule, and
when a total of the cyclic olefin-based copolymer (M) and the maleimide compound (L) is 100 parts by mass, a content of the maleimide compound (L) is 1 part by mass or more and 50 parts by mass or less,

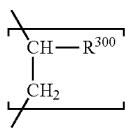
(I)

in General Formula (I), $R^{300}$ represents a hydrogen atom or a linear or branched hydrocarbon group having 1 to 29 carbon atoms,

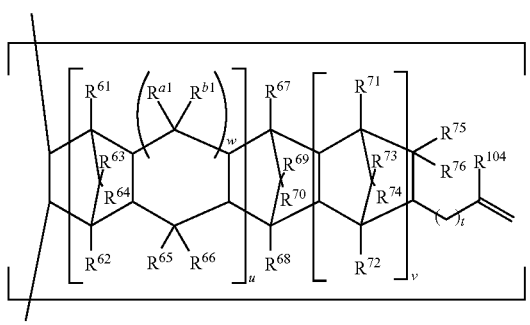
(III)

in General Formula (III), u is 0 or 1, v is 0 or a positive integer, w is 0 or 1, $R^{61}$ to $R^{76}$ and $R^{a1}$ and $R^{b1}$, which may be the same or different from each other, are a hydrogen atom, a halogen atom, an alkyl group having 1 to 20 carbon atoms, a halogenated alkyl group having 1 to 20 carbon atoms, a cycloalkyl group having 3 to 15 carbon atoms, or an aromatic hydrocarbon group having 6 to 20 carbon atoms, $R^{104}$ is a hydrogen atom or an alkyl group having 1 to 10 carbon atoms, t is a positive integer of 0 to 10, and $R^{75}$ and $R^{76}$ may bond with each other to form a monocyclic or polycyclic ring,

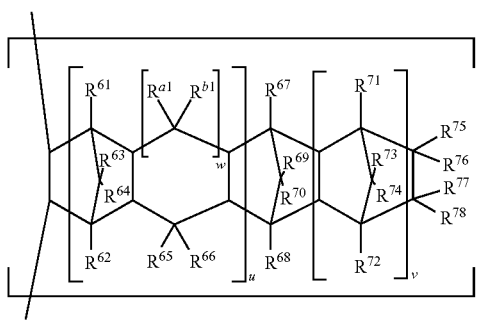
(V)

in General Formula (V), u is 0 or 1, v is 0 or a positive integer, w is 0 or 1, $R^{61}$ to $R^{78}$ and $R^{a1}$ and $R^{b1}$, which may be the same or different from each other, are a hydrogen atom, a halogen atom, an alkyl group having 1 to 20 carbon atoms, a halogenated alkyl group having 1 to 20 carbon atoms, a cycloalkyl group having 3 to 15 carbon atoms, or an aromatic hydrocarbon group having 6 to 20 carbon atoms, and $R^{75}$ to $R^{78}$ may bond with each other to form a monocyclic or polycyclic ring.

2. The cyclic olefin-based copolymer resin composition according to claim 1,
   wherein, when a total number of moles of the repeating units in the cyclic olefin-based copolymer (m) is 100 mol %, a content of the repeating units derived from the cyclic non-conjugated dienes is in a range of 19 mol % or more and 40 mol % or less.

3. The cyclic olefin-based copolymer resin composition according to claim 1,
   wherein, in the cyclic olefin-based copolymer (m), the cyclic non-conjugated diene forming the repeating unit derived from the cyclic non-conjugated dienes includes 5-vinyl-2-norbornene, and the cyclic olefin forming the repeating unit derived from the cyclic olefins includes tetracyclo[$4.4.0.1^{2,5}.1^{7,10}$]-3-dodecene.

4. The cyclic olefin-based copolymer resin composition according to claim 1,
   wherein a molecular weight of the maleimide compound (l) is 300 or more and 1000 or less.

5. The cyclic olefin-based copolymer resin composition according to claim 1, further comprising:
   a compatibility agent (C) for compatibilizing the cyclic olefin-based copolymer (M) and the maleimide compound (L).

6. The cyclic olefin-based copolymer resin composition according to claim 5,
   wherein, when the total of the cyclic olefin-based copolymer (M) and the maleimide compound (L) is 100 parts by mass, a content of the compatibility agent (C) is 0.1 parts by mass or more and 10 parts by mass or less.

7. A varnish comprising:
   the cyclic olefin-based copolymer resin composition according to claim 1; and a solvent.

8. The varnish according to claim 7,
   wherein the solvent is formed of a mixed solvent including at least one non-polar solvent (X) and at least one polar solvent (Y).

9. The varnish according to claim 8,
   wherein the non-polar solvent (X) includes at least one selected from the group consisting of toluene, xylene, cyclohexane, and decalin, and the polar solvent (Y) includes at least one selected from the group consisting of methyl isobutyl ketone, methyl ethyl ketone, diisobutyl ketone, methyl propyl ketone, and cyclohexanone, and
   when a total amount of the non-polar solvent (X) and the polar solvent (Y) is 100% by mass,
   a content of the non-polar solvent (X) is 70% by mass or more and 95% by mass or less, and
   a content of the polar solvent (Y) is 5% by mass or more and 30% by mass or less.

10. A cross-linked product obtained by cross-linking the cyclic olefin-based copolymer resin composition according to claim 1.

11. A film or sheet comprising:
    the cross-linked product according to claim 10.

12. A laminate comprising:
    the cross-linked product according to claim 10.

13. A circuit substrate comprising:
    an electrically insulating layer including the cross-linked product according to claim 10; and
    a conductor layer provided on the electrically insulating layer.

14. An electronic device comprising:
the circuit substrate according to claim 13.

15. A prepreg comprising: the cyclic olefin-based copolymer resin composition according to claim 1; and
a sheet-like fiber base material.

* * * * *